United States Patent
Zhang et al.

(10) Patent No.: US 9,093,401 B2
(45) Date of Patent: *Jul. 28, 2015

(54) ACHIEVING GREATER PLANARITY BETWEEN UPPER SURFACES OF A LAYER AND A CONDUCTIVE STRUCTURE RESIDING THEREIN

(71) Applicant: GLOBALFOUNDRIES, INC., Grand Cayman (KY)

(72) Inventors: Xunyuan Zhang, Albany, NY (US); Xiuyu Cai, Niskayuna, NY (US)

(73) Assignee: GLOBALFOUNDRIES, INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/473,266

(22) Filed: Aug. 29, 2014

(65) Prior Publication Data

US 2014/0370705 A1    Dec. 18, 2014

Related U.S. Application Data

(63) Continuation of application No. 13/754,170, filed on Jan. 30, 2013, now Pat. No. 8,883,020.

(51) Int. Cl.

| | |
|---|---|
| *H01L 21/3213* | (2006.01) |
| *H01L 21/321* | (2006.01) |
| *H05K 3/00* | (2006.01) |
| *H01L 21/768* | (2006.01) |
| *H01L 23/532* | (2006.01) |
| *H01L 45/00* | (2006.01) |
| *C09G 1/02* | (2006.01) |
| *H01L 21/283* | (2006.01) |
| *H05K 3/26* | (2006.01) |

(52) U.S. Cl.
CPC .............. *H01L 21/3212* (2013.01); *C09G 1/02* (2013.01); *H01L 21/283* (2013.01); *H01L 21/7684* (2013.01); *H01L 23/53228* (2013.01); *H01L45/1633* (2013.01); *H05K 3/00* (2013.01); *H05K 3/26* (2013.01); *H05K 2201/0376* (2013.01); *H05K 2203/0346* (2013.01)

(58) Field of Classification Search
CPC ............ H01L 21/3212; H01L 21/7684; H01L 23/53228; H01L 45/1633; C09G 1/02
See application file for complete search history.

(56) References Cited

U.S. PATENT DOCUMENTS

| | | | |
|---|---|---|---|
| 4,992,135 A | 2/1991 | Doan | |
| 5,916,855 A * | 6/1999 | Avanzino et al. | ............... 51/307 |

(Continued)

OTHER PUBLICATIONS

S. Wolf and R.N. Tauber, Silicon Processing for the VLSI Era, vol. 1, Lattice Press, ISBN 0-9616721-6-1, year 2000, pp. 745-746.*
Office Action in U.S. Appl. No. 13/754,170 dated Jan. 29, 2014, 21 pages.
Final Office Action in U.S. Appl. No. 13/754,170 dated Jun. 3, 2014, 18 pages.
Wolf et al., Silicon Processing for the VLSI Era, vol. 1, Lattice Press, ISBN 0-9616721-6-1, 2000, pp. 745-746.

*Primary Examiner* — Lan Vinh
*Assistant Examiner* — Jiong-Ping Lu
(74) *Attorney, Agent, or Firm* — Matthew M. Hulihan, Esq.; Heslin Rothenberg Farley & Mesiti, P.C.

(57) ABSTRACT

Greater planarity is achieved between surfaces of a conductive structure and a layer within which the conductive structure resides. A portion of the conductive structure protruding above the surface of the layer is selectively oxidized, at least in part, to form an oxidized portion. The oxidized portion is then removed, at least partially, to facilitate achieving greater planarity. The protruding portions may optionally be formed by selectively disposing conductive material over the conductive structure, when that the conductive structure is initially recessed below the surface of the layer. A further embodiment includes selectively oxidizing a portion of the conductive structure below the surface of the layer, removing at least some of the oxidized portion so that an upper surface of the conductive structure is below the upper surface of the layer, and planarizing the upper surface of the layer to the upper surface of the conductive structure.

20 Claims, 6 Drawing Sheets

(56) References Cited

U.S. PATENT DOCUMENTS

| | | | |
|---|---|---|---|
| 5,976,975 A * | 11/1999 | Joshi et al. | 438/672 |
| 6,326,293 B1 * | 12/2001 | Fang et al. | 438/597 |
| 2008/0096385 A1 | 4/2008 | Kim et al. | |
| 2011/0186542 A1 | 8/2011 | Li et al. | |
| 2014/0209563 A1 | 7/2014 | Zhang et al. | |

* cited by examiner

ACHIEVING GREATER PLANARITY BETWEEN UPPER SURFACES OF A LAYER AND A CONDUCTIVE STRUCTURE RESIDING THEREIN

CROSS-REFERENCE TO RELATED APPLICATIONS

This application is a continuation of U.S. Ser. No. 13/754,170, filed Jan. 30, 2013, entitled "ACHIEVING GREATER PLANARITY BETWEEN UPPER SURFACES OF A LAYER AND A CONDUCTIVE STRUCTURE RESIDING THEREIN", and which is hereby incorporated herein by reference in its entirety.

BACKGROUND OF THE INVENTION

In the manufacture of an electronic circuit having conductive structures extending to a surface of a layer, tolerances allow some degree of protrusion above, or recession below, the surface of the layer. That is, the resulting conductive structures are more or less planar to the surface of the layer, but with some allowable variation (i.e. planar deviation between the surface of the structures and the surface of the layer). Too much variation, however, is undesirable and can negatively affect the functional integrity of the circuit. What is needed is a facility for achieving greater planarity between the upper surfaces of conductive structures and a layer in which the structures reside.

BRIEF SUMMARY

The shortcomings of the prior art are overcome and additional advantages are provided through the provision of a method which includes, for instance: providing a conductive structure for an electronic circuit, the providing including: selectively oxidizing, at least in part, a protruding portion of the conductive structure protruding above a surface of a layer within which the conductive structure at least partially resides, to form an oxidized portion of the conductive structure; and removing, at least partially, the oxidized portion of the conductive structure, wherein the removing removes at least a part of the protruding portion of the conductive structure, which facilitates achieving greater planarity between the surface of the layer and an upper surface of the conductive structure.

Additionally, in another embodiment, the method further includes: forming the protruding portion of the conductive structure protruding above the surface of the layer, wherein the upper surface of the conductive structure is initially recessed below the surface of the layer, and wherein the forming comprises selectively disposing conductive material over the upper surface of the conductive structure to fill the recess and form the protruding portion of the conductive structure; and performing the selectively oxidizing and the removing to achieve the greater planarity between the surface of the layer and the upper surface of the conductive structure.

In a further embodiment, the selectively oxidizing selectively oxidizes a portion of the conductive structure below the surface of the layer, and wherein, based on the removing, the upper surface of the conductive structure is recessed below the surface of the layer, the method further includes planarizing the layer to the upper surface of the conductive structure.

Additional features and advantages are realized through the concepts of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Described herein are facilities for achieving greater planarity between upper surfaces of conductive structures and a surface of a layer in which the conductive structures at least partially reside. A particular useful application for technology described herein is electronic circuit manufacturing, and it is within this context that aspects of the present invention are described.

In semiconductor device manufacturing, a deposition process is typically followed by a removal process to remove excess deposited material. In the manufacture of some devices having metal contacts—perhaps to provide connectivity between an upper and lower layer—metal material is deposited into a via extending through a dielectric layer. The metal contact is to extend to an upper surface of that dielectric layer. A removal process follows this deposition, in order to remove excess metal overflowing the via channel. The goal of this removal process is to achieve planarity between the upper surface of the deposited metal and the upper surface of the dielectric layer.

Figure 1:
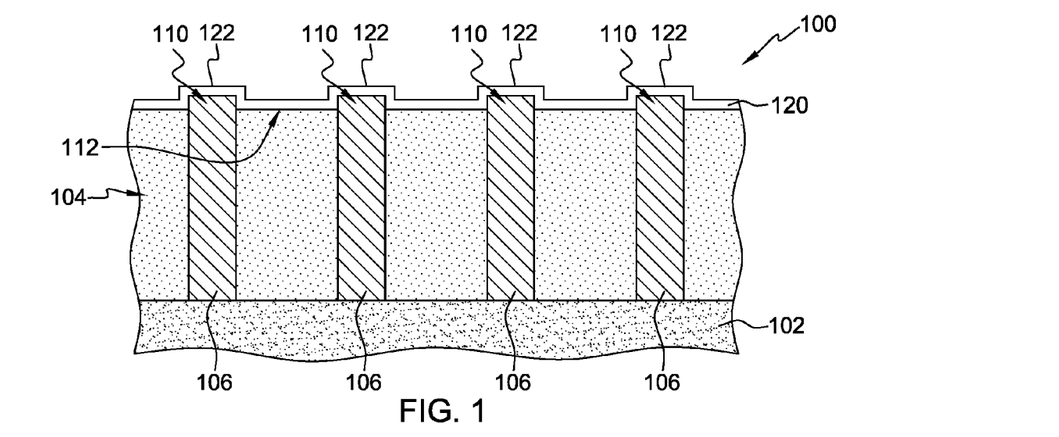
FIG. 1 illustrates unevenness of a layer overlying conductive structures, due to protrusions of the conductive structures above a surface of an underlying layer.

Achieving planarity between the surface of a layer and the surfaces of structures extending to that layer's surface is important because any unevenness may be exhibited in overlying layers, disposed over the conductive structures. FIG. 1 illustrates unevenness of a layer overlying conductive structures, where the unevenness is due to protrusions of the conductive structures above a surface of an underlying layer. In FIG. 1, a cutaway side view of chip 100 is illustrated. Chip 100 is, in one example, an intermediate structure in the formation of an electronic circuit. Chip 100 includes a bottom layer 102 over which a dielectric (e.g. silicon oxide, in one example) layer 104 is deposited. Extending through layer 104, between bottom layer 102 and top surface 112 of layer 104 are conductive structures 106. Conductive structures 106 are, in this example, metal contacts comprising Tungsten metal.

Each of the four metal contacts 106 in FIG. 1 protrude above surface 112 of layer 104, forming respective protruding portions 110 thereof. In a traditional manufacturing process, chemical-mechanical polishing (CMP) is used to polish (remove) upper portions of metal contacts 106, ideally down to surface 112. However, limitations in the CMP process when applied to some materials, such as Tungsten metal, are prohibitive of planarizing metal contacts 106 precisely down to surface 112. Instead, metal contacts 106 may protrude from surface 112, in some cases by as much as 10 nanometers (nm) or more.

Because of the presence of these protrusions, overlying layers can also exhibit protrusions. In FIG. 1, a dielectric capping layer 120 is disposed over metal contacts 106 and surface 112. Dielectric cap layer 120 is, in one example, a nitrogen-doped silicon based material, such as NBLoK. Layer 120 exhibits protrusions 122. A height of a protrusion 110 is directly translated to a height delta in layer 120. In some applications, this height delta adversely affects the final product. For instance, in some cases, protrusion of metal contacts 106 above surface 112 changes a resistance of upper layers disposed above the dielectric cap by too significant amount to remain within specifications for the electronic circuit. Example upper layers include metallization layers, such as an M1 copper layer (not pictured).

Figure 2:
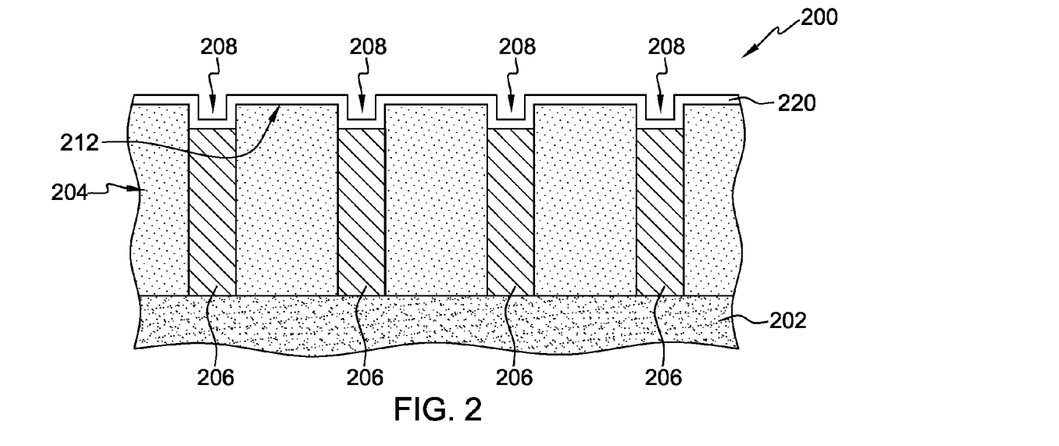
FIG. 2 illustrates unevenness of a layer overlying conductive structures, due to recesses of the conductive structures from a surface of layer.

A similar situation is depicted in FIG. 2, where recesses of the conductive structures from a surface of a layer produce unevenness of overlying layer(s). In FIG. 2, chip 200 again includes a bottom layer 202 over which a dielectric silicon oxide layer 204 is deposited, and (at least partially) through which metal contacts 206 extend. However, due to over polishing, over etching, or similar manufacturing circumstances, metal contacts 206 (Tungsten, again, in this example) are recessed by 5-10 nm from surface 212 of layer 204. Consequently, dielectric cap 220, disposed over metal contacts 206 and surface 212, exhibit recesses 208, again adversely affecting the chip at least in that upper-level layers, such as metallization layers above dielectric cap 220, may also exhibit recesses.

In accordance with aspects of the present invention, greater planarity is achieved between upper surfaces of a layer and conductive structures disposed, at least partially, within that layer. One example is illustrated and described with reference to FIGS. 3A-3C.

Figure 3A:
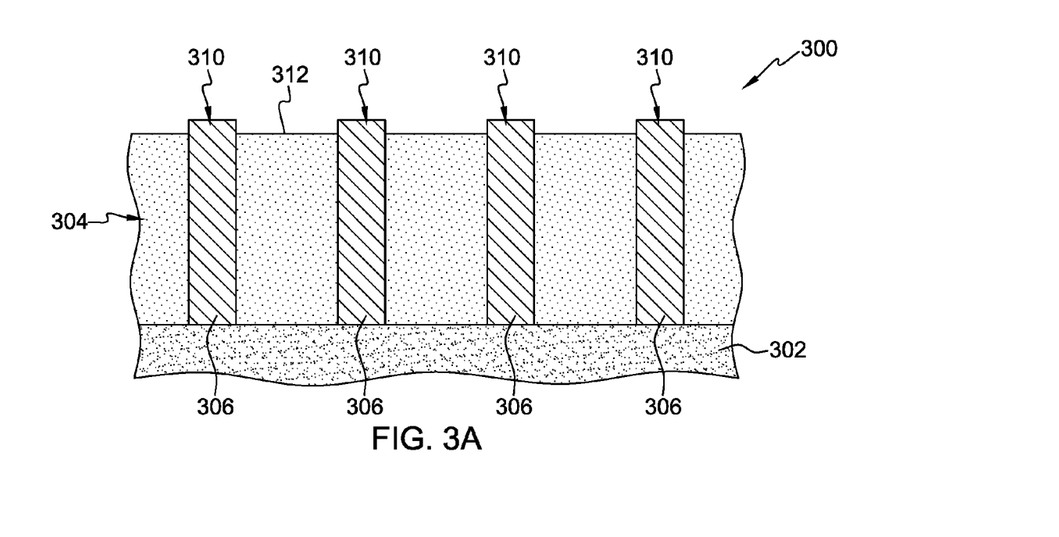
FIG. 3A depicts portions of conductive structures protruding above a surface of a layer of a chip.

FIG. 3A depicts portions of conductive structures protruding above a surface of a layer of a chip. The chip of FIG. 3A is similar to the chip of FIG. 1 except it is shown at an earlier stage of manufacture, i.e. prior to a dielectric cap layer being disposed over the conductive structures. In FIG. 3A, chip 300 includes bottom layer 302 over which a silicon oxide dielectric layer 304 is deposited. Metal contacts 306 extend through layer 304, from bottom layer 302 to above top surface 312 of layer 304, resulting in protruding portions 310 that protrude above surface 312.

As mentioned above, protrusions 310 may be the result of CMP on Tungsten metal contacts (306), which typically can achieve an accuracy to about 10 nm above (or below) surface 312. Thus, protruding portions may extend approximately 5 to 10 nm above surface 312, in one example. Though protrusions 310 in FIG. 3A are illustrated to protrude approximately the same distance above surface 312, this is for illustration purposes only, and it should be understood that, in practice, protrusions 310 may protrude from surface 312 by differing distances. For instance, one protrusion may protrude 5 nm above surface 312, while another protrudes 8.5 nm above surface 312.

In accordance with aspects of the present invention, grater planarity is achieved by selectively oxidizing at least some of the protruding portions of metal contacts 306, and removing at least a portion of the oxidized metal. It is noted that, as used herein, oxidation, oxidizing, oxidized, etc. does not necessary imply that a reaction with oxygen is/was involved, though such may be the case in some situations. Those having ordinary skill in the art will readily recognize that oxidation, in its broader sense, refers to the exchange of electrons to form an oxide. Using the examples above in which the metal contacts are Tungsten metal, the Tungsten is selectively oxidized to form Tungsten oxide, a material that is more readily removable than its non-oxidized counterpart using known processes (such as described in U.S. Pat. No. 4,992,135, which is hereby incorporated herein by reference in its entirety).

A metal contact may be selectively oxidized by way of one of more known surface modification methods. One example method is a gas cluster ion beam (GCIB) process, which is one example of surface glancing oxidation. Methods and apparatuses for accomplishing oxidation by way of GCIB are known in the art, for instance those offered by Tokyo Electron Limited (Minato-ku, Tokyo, Japan) and/or its subsidiaries.

Figure 3B:
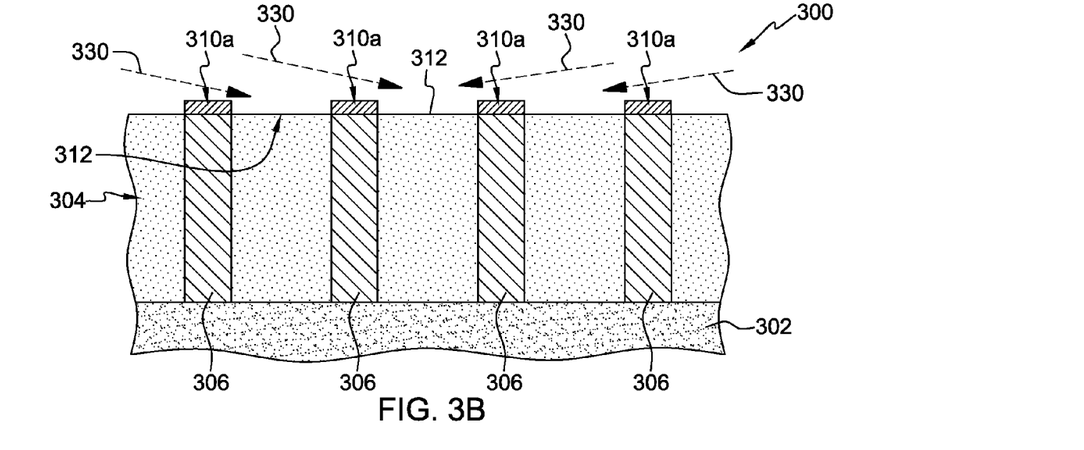
FIG. 3B depicts selective oxidation of the protruding portions of FIG. 3A to form oxidized portions of the conductive structures, in accordance with one or more aspects of the present invention.

FIG. 3B depicts selective oxidation of the protruding portions of FIG. 3A to form oxidized portions of the conductive structures, in accordance with one or more aspects of the present invention. In FIG. 3B, surface modification is performed by GCIB, in which gas cluster ion beams 330 are introduced to protrusions 310, causing metal oxide formation, i.e. Tungsten oxide in this example. As a result, oxidized portions 310a are formed.

As is seen in FIG. 3B, an angle of incidence of GCIBs 330 is less than 90 degrees relative to surface 312. Control of the angle of incidence, as those having ordinary skill in the art recognize, facilitates oxidizing the metal contacts down to a desired depth (for instance to a depth substantially in alignment with surface 312 of layer 304). Current state of GCIB technology can oxidize to an accuracy of about 1-2 nm of the desired depth.

Figure 3C:
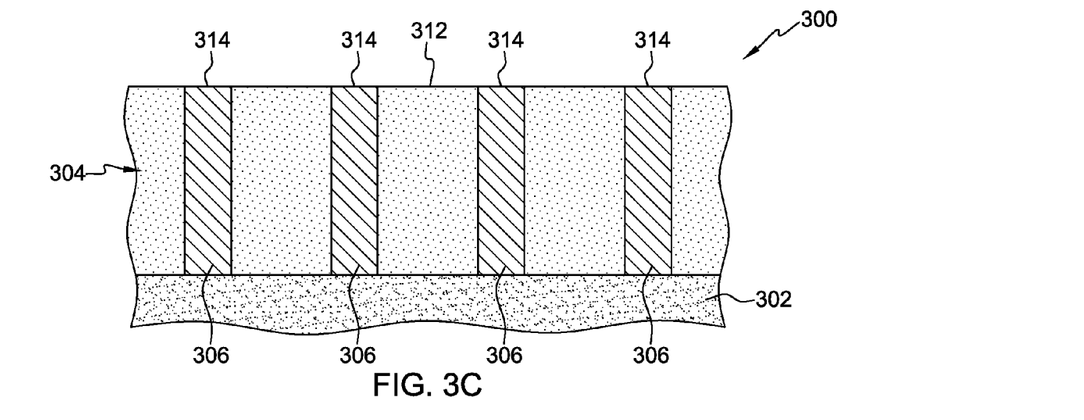
FIG. 3C depicts the chip of FIG. 3B wherein the oxidized portions are removed, thereby achieving greater planarity between the surface of the layer and upper surfaces of the conductive structures, in accordance with one or more aspects of the present invention.

After performing the selective oxidation of FIG. 3B, the oxidized portions are then at least partially removed. Various methods for removal of metal oxides, such as by etching or chemical-mechanical polishing, are known in the art. Removal of the oxidized portions achieves greater planarity between the surface of the layer and the upper surfaces of the conductive structures, as depicted in FIG. 3C. Most or all of oxidized portions 310a have been removed, exposing surfaces 314 (of metal contacts 306), which are substantially planar to surface 312 of layer 304. In one example, based on the selectively oxidizing and the removing, upper surfaces 314 protrude above (or are recessed below) surface 312 by less than about 4 nm. In many cases, the precision is even greater, i.e. to within 1 nm. In some embodiments, an angle of incidence of GCIBs 330 is less than 5 degrees relative to surface 312, advantageously achieving a tolerance of about 1 nm (as compared to a tolerance of about 5 nm when using CMP alone, without the selective oxidation and oxide removal as described herein).

Figure 4A:
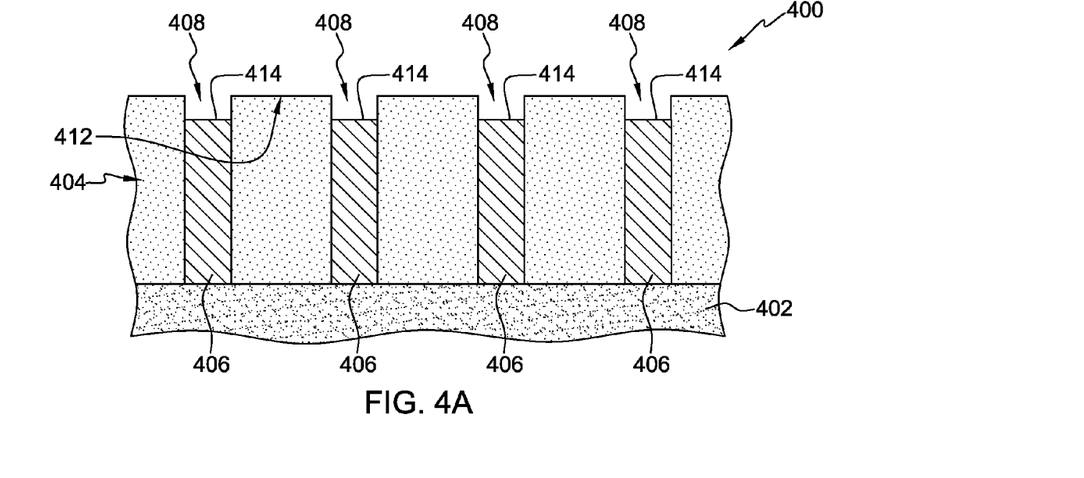
FIG. 4A depicts conductive structures having upper surfaces recessed from a surface of a layer of a chip.

FIG. 3A depicts a scenario in which metal contacts 306 protrude above surface 312. In some cases, the metal contacts are instead initially recessed below surface 312. FIG. 4A depicts such a situation, where conductive structures have upper surfaces recessed from a surface of a layer. As before, a chip 400 includes bottom layer 402 over which a silicon oxide dielectric layer 404 is deposited. Metal contacts 406 extend through layer 404, from bottom layer 402 to below top surface 412 of layer 404, forming recesses 408, where upper surfaces 414 of metal contacts 406 are below surface 412. Recesses 408 may have been formed because of over-polishing or because of recessed via etches (vias etched too deeply), as examples. As before, though recesses in FIG. 4A are illustrated having approximately the same depth below surface 412, this is for illustration purposes only, and it should be understood that, in practice, the recesses may extend to differing depths. For instance, one recess may be 5 nm deep, while another recess is 8.5 nm deep.

Figure 4B:
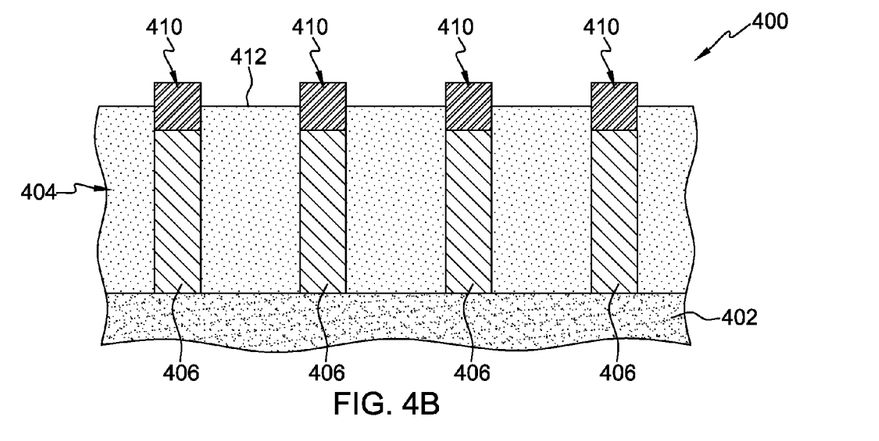
FIG. 4B depicts the chip of FIG. 4A, wherein conductive material is selectively disposed over the upper surfaces of the conductive structures to form protruding portions of the conductive structures, in accordance with one or more aspects of the present invention.

Thus, in accordance with another aspect of the present invention, conductive material is selectively disposed over upper surfaces 412 of conductive structures 406, as depicted in FIG. 4B. The conductive material is disposed to form protruding portions 410 of the conductive structures.

In one example, conductive material is selectively grown above structures 406 by chemical vapor deposition (CVD). CVD can facilitate deposition of a metal, such as Tungsten in the above examples, above the metal contacts and absent significant collateral deposition of the metal onto the interlayer dielectric (ILD) layer 404.

After protruding portions 410 are formed, the result is a chip of the form depicted above in FIG. 3A, i.e. having protruding portions (310 of FIG. 3A). Thus, the process described in connection with FIGS. 3A-3C is thereafter performed to planarize the surfaces of the metal contacts with the surface of the dielectric layer, as described above.

Cases may arise in which some metal contacts of a chip protrude from the surface of the dielectric layer and other metal contacts of that chip are recessed below the surface of the dielectric layer. It should be understood that the process described above in connection with FIGS. 4A and 4B could therefore be used to fill the recesses, in order to make those metal contacts protrude from the dielectric layer. The process described above in connection with FIGS. 3A-3C can then be performed on all (or at least some) of the metal contacts of the chip to planarize the surface of those contacts with the surface of the layer. In this manner, a chip having both protruding portions and recessed conductive structures can be planarized to the dielectric layer surface.

Figure 5A:
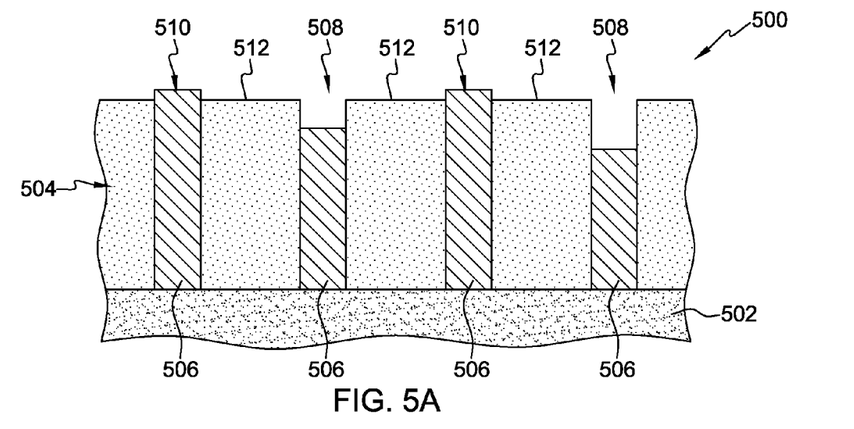
FIG. 5A depicts a chip having conductive structures that protrude above a surface of a layer of the chip and having conductive structures with upper surfaces recessed from the surface of the layer of the chip.
Figure 5B:
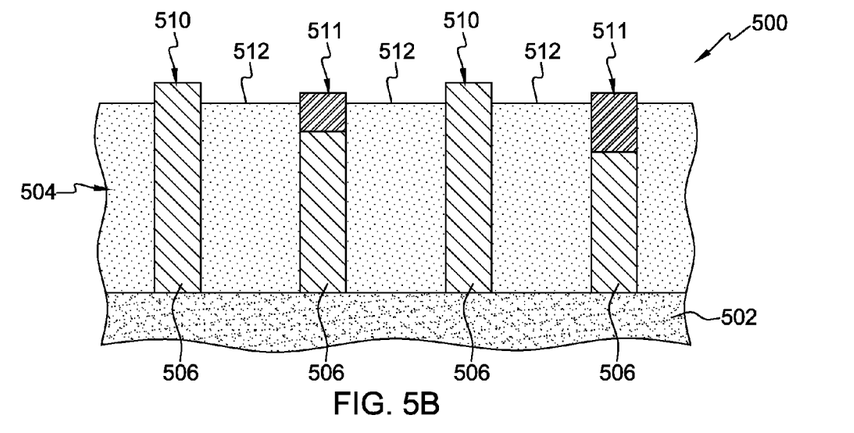
FIG. 5B depicts the chip of FIG. 5B, wherein conductive material is selectively disposed over the upper surfaces of the conductive structures with upper surfaces recessed from the surface of the layer of the chip to form protruding portions of the conductive structures, in accordance with one or more aspects of the present invention.

By way of example, FIG. 5A depicts a chip having conductive structures that protrude above a surface of a layer of the chip and having conductive structures with upper surfaces recessed from the surface of the layer of the chip. In FIG. 5A, two conductive structures 506 (of those depicted) have protruding portions 510 protruding above surface 512, while two conductive structures 506 are recessed (exhibiting recesses 508) below surface 512. In this situation, CVD may deposit conductive material to fill recesses 508 and form protruding portions of the formerly recessed conductive structures. See FIG. 5B, which depicts the chip of FIG. 5B after conductive material is selectively disposed over the upper surfaces of the conductive structures having upper surfaces recessed from the surface of the layer of the chip to form protruding portions of those conductive structures. Additionally, in this example, the CVD deposits additional conductive material over the already-protruding portions (510), causing them to protrude even farther from surface 512. The result is a chip of the form depicted above in FIG. 3A, i.e. having protruding portions (310 of FIG. 3A). Therefore, the process described above with reference to FIGS. 3A-3C can be performed to planarize the surfaces of the metal contacts (506) with the surface of the dielectric layer (512).

Figure 6A:
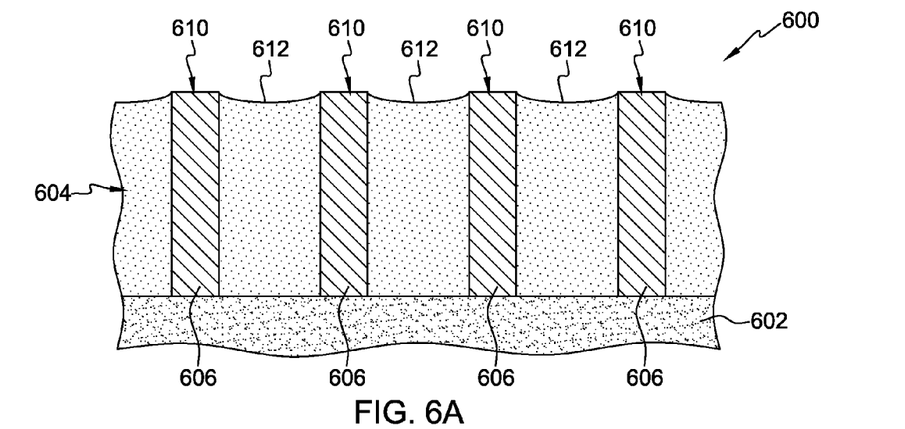
FIG. 6A depicts dishing of an upper surface of a layer of a chip, in which conductive structures at least partially reside in the layer, and in which portions of the conductive structures protrude above the dished surface of the layer.

FIG. 6A depicts dishing of an upper surface of a layer of a chip, in which conductive structures at least partially reside in the layer, and in which portions of the conductive structures protrude above the dished surface of the layer. In chip 600, layer 604 is disposed above bottom layer 602. Conductive structures 606 extend through layer 604 and again include protruding portions 610 protruding above surface 612 of layer 604. Dielectric dishing, an effect known by those skilled in the art, is exhibited in surface 612 of dielectric layer 604, between conductive structures 606.

Figure 6B:
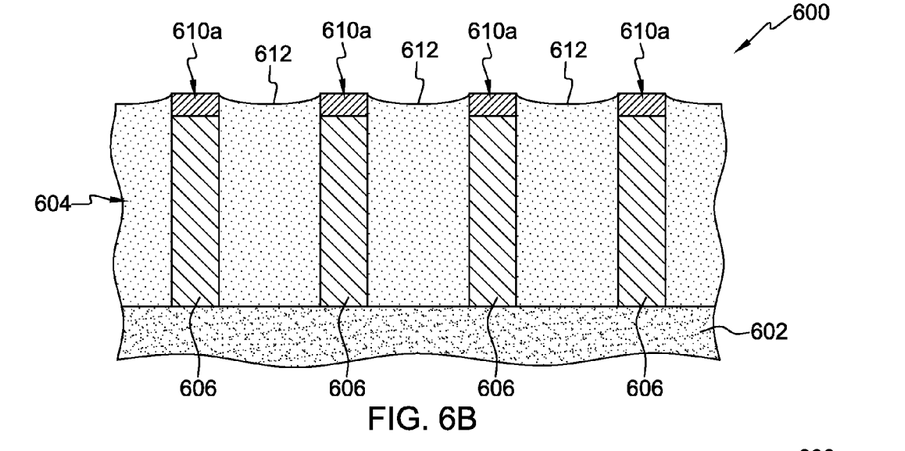
FIG. 6B depicts oxidized portions of the conductive structures of FIG. 6A, in accordance with one or more aspects of the present invention.

As before, and in accordance with an aspect of the present invention, portions 610 of metal contacts 606 are selectively oxidized to produce oxidized portions of the metal contacts (see FIG. 6B, 610a). In one example, a GCIB process is used to selectively oxidize not only the portion of the metal contact protruding above dished surface 612, but also a portion of the metal contacts below surface 612, resulting in oxidized portions 610a. In one example, the angle of incidence of the GCIBs on protruding portions 610 is 80-100 degrees, and, more particularly, is substantially orthogonal (88-92 degrees) to the upper surface of the metal contacts.

Figure 6C:
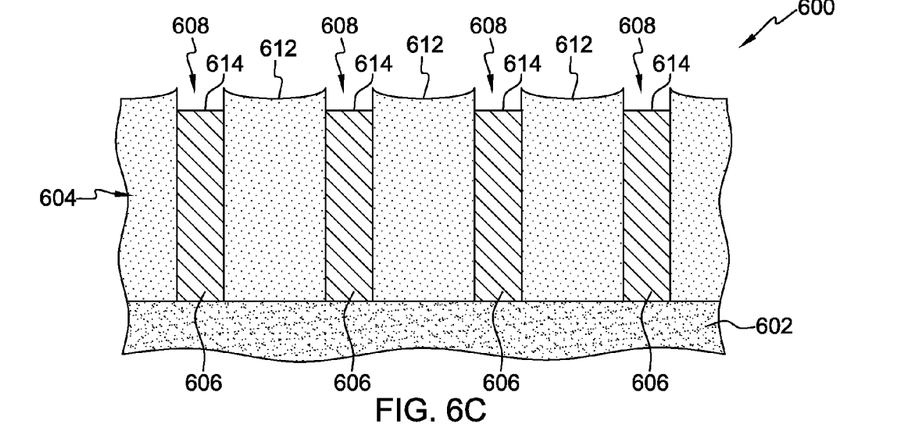
FIG. 6C depicts conductive structures having upper surfaces recessed from a dished surface of the layer based on removal of the oxidized portions from FIG. 6B, in accordance with one or more aspects of the present invention.

Oxidized portions 610a can then be selectively removed, e.g. by etching or touch-up CMP, as examples, to remove upper portions of the metal contacts, thereby exposing upper surfaces that are recessed from the dished surface of the dielectric layer, as depicted in FIG. 6C. Upper surfaces 614 of metal contacts 606 are dished below surface 612, producing recesses 608.

Figure 6D:
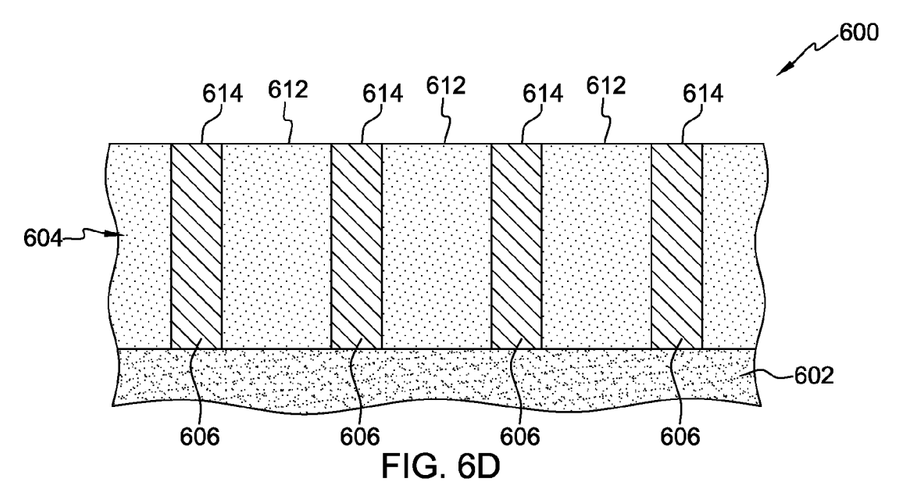
FIG. 6D depicts the chip of FIG. 6C, wherein portions of the upper layer are removed, to achieve greater planarity between the surface of the layer and upper surfaces of the conductive structures, in accordance with one or more aspects of the present invention.

The above can be followed by a material removal process, such as CMP, to remove an upper portion of dished dielectric layer 604. This is performed to planarize the layer with upper surfaces 612 of metal contacts 606. FIG. 6D depicts achieving greater planarity between the surface of the layer and upper surfaces of the metal contacts in this manner, i.e. through removal of the dished portions of the upper layer. Surfaces 614 and 612 are thereby made substantially planar by way of the dielectric layer CMP process.

Figure 7:
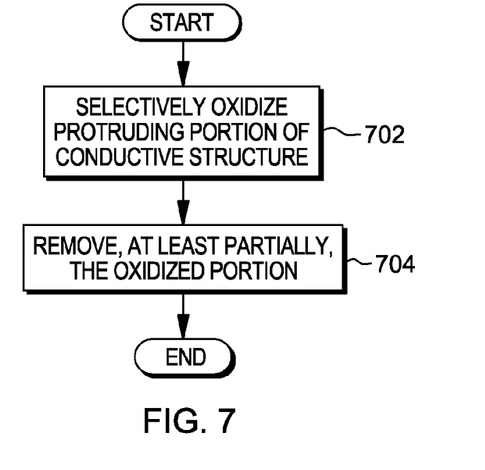
FIG. 7 depicts one example of a process for providing a conductive structure for an electronic circuit, in accordance with aspects of the present invention.
Figure 8:
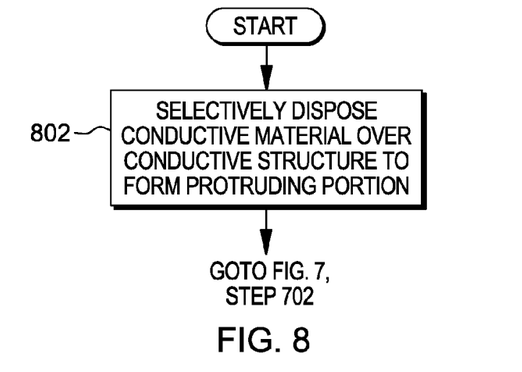
FIG. 8 depicts another example of a process for providing a conductive structure for an electronic circuit, in accordance with aspects of the present invention.

FIGS. 6-8 depict example processes for providing a conductive structure for an electronic circuit, in accordance with aspects of the present invention. The processes are performed, at least partially, using machinery and other equipment for achieving the functions specified by each process step, for instance by GCIB and CMP equipment. Such equipment is familiar to those having ordinary skill in the art.

FIG. 7 depicts an example of a process for providing a conductive structure for an electronic circuit, when a conductive structure protrudes above a surface of a layer through which the conductive structure at least partially resides. The process of FIG. 7 follows the example of FIGS. 3A-3C. Thus, the process begins by selectively oxidizing a protruding portion of the conductive structure (702), and then proceeds by removing, at least partially, the oxidized portion (704). The selective oxidation and removing are performed, in one example, as described above.

In one example, the process of FIG. 7 is concurrently performed on many such conductive structures. That is, a plurality of protruding portions are concurrently selectively oxidized, as depicted in FIG. 3B, and the plurality of resulting oxidized portions are, at least partially, concurrently removed, for instance by a CMP or etching process.

FIG. 8 depicts an example process for providing a conductive structure when an upper surface of a conductive structure is initially recessed below a surface of a layer through which the conductive structure at least partially resides. The process of FIG. 8 follows the example of FIGS. 4A and 4B. Thus, the process begins by selectively disposing conductive material over the conductive structure (e.g. above the upper surface thereof) (802) to form a protruding portion of the conductive structure, where the protruding portion protrudes above the surface of the layer. The process continues to the steps of FIG. 7, described above, i.e. to selective oxidation of the protruding portion, and (at least partial) removal of the oxidized portion of the conductive structure.

In one example, the process of FIG. 8 is concurrently performed on many such conductive structures. That is, upper surfaces of a plurality of conductive structures are initially recessed below a surface of a layer within which the conductive structures at partially reside. Conductive material is concurrently selectively disposed over the conductive structures to form a plurality of protruding portions thereof, as depicted in FIG. 4B. The plurality of protruding portions are concurrently selectively oxidized, as depicted in FIG. 3B, and the plurality of resulting oxidized portions are, at least partially, concurrently removed, for instance by a CMP or etching process.

In addition, as described above with respect to FIGS. 5A and 5B, in some examples, a plurality of conductive structure are present, wherein some protrude above the surface of the dielectric layer and some are recessed below the surface. In that case, conductive material can be disposed over some or all of the recessed conductive structures to build them up such that all of the plurality of conductive structures protrude above the surface of the dielectric layer. That can be followed by the process described with reference to FIG. 3A-3C to planarize the surfaces of the conductive structures with the surface of the dielectric layer, as described above FIG. 9 depicts an example process for providing a conductive structure when dishing is exhibited in the layer within which the conductive structure at least partially resides. The process of FIG. 8 follows the example of FIGS. 6A-6D above. The process begins with selectively oxidizing a protruding portion of the conductive structure (902), and then continues by removing, at least partially, the oxidized portion (904). Lastly, the layer is planarized to the upper surface of the conductive structure (906), to achieve greater planarity between the surface of the conductive structure and the surface of the layer.

Figure 9:
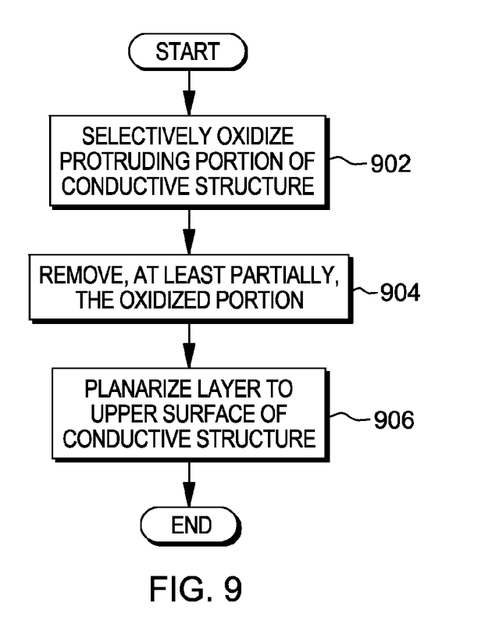
FIG. 9 depicts a further example of a process for providing a conductive structure for an electronic circuit, in accordance with aspects of the present invention.

In one example, the process of FIG. 9 is concurrently performed on many such conductive structures. That is, a plurality of protruding portions of the conductive structures are concurrently selective oxidized, the plurality of resulting oxidized portions are, at least partially, concurrently removed, and the layer is planarized to the upper surfaces of the conductive structures.

Aspects described above provide greater surface planarity between, for instance, back end of line (BEOL) components in an electronic circuit, for instance between Tungsten metal contacts and layer(s) disposed above those contacts, such as metallization layer(s). Current practices—using CMP for instance to polish metal contacts—are typically accurate to about 5-10 nm. Advantageously, aspects of the present invention facilitate achieving, for such back-end applications, planarity to within about 1 nm accuracy (i.e. deviation in height between metal contact and dielectric layer is a maximum of about 1 nm).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
   providing a conductive structure for an electronic circuit, the providing comprising:
   selectively oxidizing, at least in part, a protruding portion of the conductive structure protruding above a surface of a layer within which the conductive structure at least partially resides, the selectively oxidizing comprising controllably oxidizing the protruding portion down to a controlled depth less than 5 nanometers above or below the surface of the layer based on targeting the surface of the layer, to form an oxidized portion of the conductive structure; and
   subsequent to the selectively oxidizing, removing, at least partially, the oxidized portion of the conductive structure, wherein the removing removes at least a part of the protruding portion of the conductive structure, which facilitates achieving planarity between the surface of the layer and an upper surface of the conductive structure.

2. The method of claim 1, wherein the controlled depth is selected prior to the selectively oxidizing.

3. The method of claim 2, wherein the controlled depth is a 1 nanometer window of depths.

4. The method of claim 1, wherein the selectively oxidizing comprises controllably oxidizing the protruding portion down to a controlled depth less than 2 nanometers above or below the surface of the layer.

5. The method of claim 1, wherein the selectively oxidizing and the removing the oxidized portion are performed as part of a dry etch process.

6. The method of claim 1, wherein the conductive structure comprises a metal contact and wherein the layer comprises a dielectric layer.

7. The method of claim 1, wherein the providing further comprises:
   forming the protruding portion of the conductive structure protruding above the surface of the layer, wherein the upper surface of the conductive structure is initially recessed below the surface of the layer, and wherein the forming comprises selectively disposing conductive material over the upper surface of the conductive structure to fill the recess and form the protruding portion of the conductive structure; and
   performing the selectively oxidizing and the removing to achieve the planarity between the surface of the layer and the upper surface of the conductive structure.

8. The method of claim 1, wherein, based on the removing, the upper surface of the conductive structure is recessed below the surface of the layer, and wherein the method further comprises planarizing the layer to the upper surface of the conductive structure.

9. A method comprising:
   providing a conductive structure for an electronic circuit, the providing comprising:
   controllably processing a protruding portion of the conductive structure protruding above a surface of a layer within which the conductive structure at least partially resides, the controllably processing comprising selectively oxidizing, at least in part, the protruding portion of the conductive structure down to a depth below a surface of the conductive structure, to form an oxidized portion of the conductive structure; and
   subsequent to the controllably processing, removing, at least partially, the oxidized portion of the conductive structure, wherein the removing removes at least a part of the protruding portion of the conductive structure, which facilitates achieving planarity between the surface of the layer and an upper surface of the conductive structure, wherein the removing the oxidized portion comprises performing a chemical-mechanical polishing process, and wherein the selectively oxidizing is performed separate from the chemical-mechanical polishing process and prior to performing the chemical-mechanical polishing process.

10. The method of claim 9, wherein the depth comprises a depth selected prior to the selectively oxidizing.

11. The method of claim 9, wherein the selectively oxidizing comprises controllably oxidizing the protruding portion down to a controlled depth less than 2 nanometers above or below the surface of the layer.

12. The method of claim 9, wherein the conductive structure comprises a metal contact and wherein the layer comprises a dielectric layer.

13. The method of claim 9, wherein the providing further comprises:
   forming the protruding portion of the conductive structure protruding above the surface of the layer, wherein the upper surface of the conductive structure is initially recessed below the surface of the layer, and wherein the forming comprises selectively disposing conductive material over the upper surface of the conductive structure to fill the recess and form the protruding portion of the conductive structure; and
   performing the controllably processing and the removing to achieve the planarity between the surface of the layer and the upper surface of the conductive structure.

14. The method of claim 9, wherein, based on the removing, the upper surface of the conductive structure is recessed below the surface of the layer, and wherein the method further comprises planarizing the layer to the upper surface of the conductive structure.

15. A method comprising:
   providing a conductive structure for an electronic circuit, the providing comprising:
   selectively oxidizing, at least in part, a protruding portion of the conductive structure protruding above a surface of a layer within which the conductive structure at least partially resides, the selectively oxidizing comprising controllably oxidizing the protruding portion down to a controlled depth less than 5 nanometers above or below the surface of the layer, to form an oxidized portion of the conductive structure; and
   subsequent to the selectively oxidizing, removing, at least partially, the oxidized portion of the conductive structure, wherein the removing removes at least a part of the protruding portion of the conductive structure, which facilitates achieving planarity between the surface of the layer and an upper surface of the conductive structure, wherein the removing the oxidized portion comprises performing a chemical-mechanical polishing process, and wherein the selectively oxidizing is performed separate from the chemical-mechanical polishing process and prior to performing the chemical-mechanical polishing process.

16. The method of claim 15, wherein the controlled depth is selected prior to the selectively oxidizing.

17. The method of claim 16, wherein the controlled depth is a 1 nanometer window of depths.

18. The method of claim 15, wherein the conductive structure comprises a metal contact and wherein the layer comprises a dielectric layer.

19. The method of claim 15, wherein the providing further comprises:
- forming the protruding portion of the conductive structure protruding above the surface of the layer, wherein the upper surface of the conductive structure is initially recessed below the surface of the layer, and wherein the forming comprises selectively disposing conductive material over the upper surface of the conductive structure to fill the recess and form the protruding portion of the conductive structure; and
- performing the selectively oxidizing and the removing to achieve the planarity between the surface of the layer and the upper surface of the conductive structure.

20. The method of claim 15, wherein, based on the removing, the upper surface of the conductive structure is recessed below the surface of the layer, and wherein the method further comprises planarizing the layer to the upper surface of the conductive structure.

\* \* \* \* \*